US007816866B2

(12) United States Patent
Nakajima et al.

(10) Patent No.: US 7,816,866 B2
(45) **Date of Patent: *Oct. 19, 2010**

(54) PHOTOCATHODE COMPRISING A PLURALITY OF OPENINGS ON AN ELECTRON EMISSION LAYER

(75) Inventors: Kazutoshi Nakajima, Hamamatsu (JP); Minoru Niigaki, Hamamatsu (JP); Tomoko Mochizuki, Hamamatsu (JP); Toru Hirohata, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 803 days.

This patent is subject to a terminal disclaimer.

(21) Appl. No.: 11/585,936

(22) Filed: Oct. 25, 2006

(65) Prior Publication Data

US 2007/0096648 A1 May 3, 2007

(30) Foreign Application Priority Data

Oct. 31, 2005 (JP) .......................... P2005-316908

(51) Int. Cl.
*H01J 40/06* (2006.01)
*H01J 37/08* (2006.01)
*G21K 5/10* (2006.01)
*H01L 29/12* (2006.01)

(52) U.S. Cl. ............... 313/542; 250/492.2; 250/492.24; 257/10

(58) Field of Classification Search ................. 313/542; 250/492.2, 492.24; 257/10
See application file for complete search history.

(56) References Cited

U.S. PATENT DOCUMENTS 4,907,051 A * 3/1990 Ehara .......................... 257/10
5,047,821 A * 9/1991 Costello et al. ............... 257/11
5,471,051 A * 11/1995 Niigaki et al. ........ 250/214 VT
6,002,141 A * 12/1999 Niigaki et al. ................ 257/10
6,917,058 B2 * 7/2005 Niigaki et al. ............. 257/103
7,365,356 B2 * 4/2008 Hirohata et al. ............... 257/10
2002/0011787 A1 * 1/2002 Niigaki et al. ............. 313/527

(Continued)

FOREIGN PATENT DOCUMENTS

CN 1527341 9/2004

(Continued)

*Primary Examiner*—Sikha Roy
*Assistant Examiner*—Jose M Diaz
(74) *Attorney, Agent, or Firm*—Drinker Biddle & Reath LLP

(57) ABSTRACT

A semiconductor photocathode 1 includes: a transparent substrate 11; a first electrode 13, formed on the transparent substrate 11 and enabling passage of light that has been transmitted through the transparent substrate 11; a window layer 14, formed on the first electrode 13 and formed of a semiconductor material with a thickness of no less than 10 nm and no more than 200 nm; a light absorbing layer 15, formed on the window layer 14, formed of a semiconductor material that is lattice matched to the window layer 14, is narrower in energy band gap than the window layer 14, and in which photoelectrons are excited in response to the incidence of light; an electron emission layer 16, formed on the light absorbing layer 15, formed of a semiconductor material that is lattice matched to the light absorbing layer 15, and emitting the photoelectrons excited in the light absorbing layer 15 to the exterior from a surface; and a second electrode 18, formed on the electron emission layer.

14 Claims, 7 Drawing Sheets

U.S. PATENT DOCUMENTS

| | | | | |
|---|---|---|---|---|
| 2004/0089860 | A1* | 5/2004 | Edamura et al. | 257/10 |
| 2004/0094755 | A1* | 5/2004 | Hirohata et al. | 257/10 |
| 2005/0168144 | A1* | 8/2005 | Hirohata et al. | 313/542 |
| 2006/0138395 | A1* | 6/2006 | Kohno et al. | 257/10 |
| 2007/0034987 | A1* | 2/2007 | Costello et al. | 257/532 |
| 2008/0121928 | A1* | 5/2008 | Niigaki et al. | 257/184 |

FOREIGN PATENT DOCUMENTS

| | | | |
|---|---|---|---|
| JP | 4-30706 | | 5/1992 |
| JP | 9-199075 | | 7/1997 |
| JP | 09-213205 | | 8/1997 |
| JP | 2902708 | | 3/1999 |
| JP | 2003338260 | A * | 11/2003 |

* cited by examiner

PHOTOCATHODE COMPRISING A PLURALITY OF OPENINGS ON AN ELECTRON EMISSION LAYER

BACKGROUND OF THE INVENTION

1. Field of the Invention

The present invention relates to a photocathode.

2. Related Background Art

Photocathodes are used in photodetectors and other measuring devices, and for example, a transmission type photocathode, described in (Patent Document 1: Japanese Published Unexamined Patent Application No. H9-199075) is used. This transmission type photocathode is sensitive to near infrared light and has a window layer, formed of InAlGaAs on a light incidence side of a light absorbing layer, formed of an InGaAs-based material.

With photocathodes, forming of a transparent conductive film on a light incidence side of a light absorbing layer to lower a surface resistance that obstructs analysis of high-speed phenomena, etc., using a photodetector is known (see Patent Document 2: Japanese Published Examined Patent Application No. H4-30706). The provision of a mesh electrode or an island electrode at a light incidence side to apply a bias voltage in a photocathode used in a photodetector is also known (Patent Document 3: Japanese Patent No. 2902708).

Meanwhile, as an application example of a photodetector, fluorescence lifetime analysis, in which a sample is excited by light and a variation in time of an intensity of a fluorescence emitted by the sample is measured, can be cited. A photodetector used for fluorescence lifetime analysis has an electron tube, such as a photomultiplier tube, an image intensifier tube, or a streak tube, in which a photocathode is incorporated. Generally in fluorescence lifetime analysis using a photodetector, a pulsed light of a short wavelength (such as visible laser light) is used as the light for sample excitation and a fluorescence of a longer wavelength than the pulsed light (for example, infrared fluorescence) is measured.

SUMMARY OF THE INVENTION

However, because the photocathode described in Patent Document 1 is narrow in the wavelength band of incident light that can excite photoelectrons, though the photocathode has adequate sensitivity to wavelengths of infrared fluorescence, it does not have sensitivity to wavelengths of visible laser light as well as wavelengths of an ultraviolet band. The inventions described in Patent Documents 2 and 3 do not provide an effect of widening the wavelength band in terms of the sensitivity of a photocathode. Thus, conventionally, separate photocathodes have to be used according to the wavelength of the detected light, and separate photodetectors are prepared for the excitation light and for the fluorescence.

An object of the present invention is thus to provide a semiconductor photocathode having a flat sensitivity for light of a wide wavelength band.

The present inventor examined various laminated structures as well as shapes and materials of light absorbing layers and other layers, mainly in terms of semiconductor photocathodes that are made to operate by application of a bias voltage. As a result, the present inventor noted that with conventional semiconductor photocathodes, before reaching a light absorbing layer, in which photoelectrons are excited in response to incidence of light, light of a wavelength band of sensitivity (especially visible to ultraviolet light) is blocked by a layer (such as a window layer) disposed at a light incidence side of the light absorbing layer, and thus came to conceive the present invention.

A semiconductor photocathode according to the present invention includes: a transparent substrate; a first electrode, formed on the transparent substrate and enabling passage of light that has been transmitted through the transparent substrate; a light absorbing layer, formed on the first electrode and in which photoelectrons are excited in response to an incidence of light; a window layer, interposed between the first electrode and the light absorbing layer and being formed of a semiconductor material that is wider in energy band gap than the light absorbing layer, is lattice matched to the light absorbing layer, and has a thickness of no less than 10 nm and no more than 200 nm; an electron emission layer, formed on the light absorbing layer, formed of a semiconductor material that is lattice matched to the light absorbing layer, and emitting the photoelectrons excited in the light absorbing layer to the exterior from a surface; and a second electrode, formed on the electron emission layer.

With the semiconductor photocathode according to the present invention, though the window layer that is lattice matched to the semiconductor material of the light absorbing layer is formed on the light incidence side, the thickness of the window layer is extremely thin. Thus, in a state in which a bias voltage is applied, light of a wide wavelength band, from an ultraviolet band to a near infrared band, that is transmitted through the transparent substrate passes through the first electrode and, without hardly being blocked thereafter by the window layer, is made incident on the light absorbing layer, and photoelectrons are thereby excited. The excited photoelectrons are emitted to the exterior via the electron emission layer. A semiconductor photocathode with sensitivity to light of a wide wavelength band is thus provided.

Also, with the above-described semiconductor photocathode, the first electrode may be a metal material layer with a thickness of no less than 5 nm and no more than 100 nm. With this arrangement, even if the first electrode is formed of a metal material, light of a wide wavelength band can be transmitted with the first electrode having a thickness that is controllable in terms of manufacture.

Also, the first electrode may be a metal material layer with a thickness of no less than 10 nm and no more than 50 nm. With this arrangement, when the first electrode is formed of a metal material, light of an even wider wavelength band can be transmitted toward the light absorbing layer while applying the bias voltage uniformly on the semiconductor photocathode.

Also, the first electrode may be formed of a metal material having openings. With this arrangement, even if the first electrode is arranged as a metal material layer, light can be passed through toward the light absorbing layer via the openings.

Also, the first electrode may be formed of at least one type of transparent conductive material selected from the group consisting of ITO, ZnO, $In_2O_3$, and $SnO_2$. By using a transparent conductive material that transmits light in the first electrode, the light transmitted through the transparent substrate can be passed through toward the light absorbing layer while providing the function of an electrode.

With the above-described semiconductor photocathode, the thickness of the window layer may be no less than 20 nm and no more than 100 nm. By making the thickness of the window layer be in this range, the bias voltage can be applied satisfactorily even with a thickness that enables the forming of a uniform layer and light of a wide wavelength band can be transmitted satisfactorily.

The above-described semiconductor photocathode may furthermore include: a contact layer, interposed between the electron emission layer and the second electrode and formed of a semiconductor material that is lattice matched to the electron emission layer. Because by providing a contact layer, a contact resistance between the electron emission layer and the second electrode can be lowered, the bias voltage can be applied effectively.

The above-described semiconductor photocathode may furthermore include: an insulating film, interposed between the transparent substrate and the first electrode. By providing such an insulating film, an effect of improving the adherence of the transparent substrate and semiconductor materials is provided.

The above-described semiconductor photocathode may furthermore include: an antireflection film, interposed between the transparent substrate and the first electrode. By providing the antireflection film, reflectance at desired wavelengths can be reduced in regard to light that is made incident on the light absorbing layer and the photoelectron emission efficiency can be improved.

Thus, with the present invention, light of a wide wavelength band from an ultraviolet band to a near infrared band can be made incident on the light absorbing layer in the state in which the bias voltage is applied. A semiconductor photocathode with a flat sensitivity for a wide wavelength band can thus be provided.

DESCRIPTION OF THE PREFERRED EMBODIMENT

Semiconductor photocathodes according to embodiments of the present invention shall now be described with reference to the attached drawings. Elements that are the same shall be provided with the same symbol, and overlapping description shall be omitted.

First Embodiment

Figure 1:
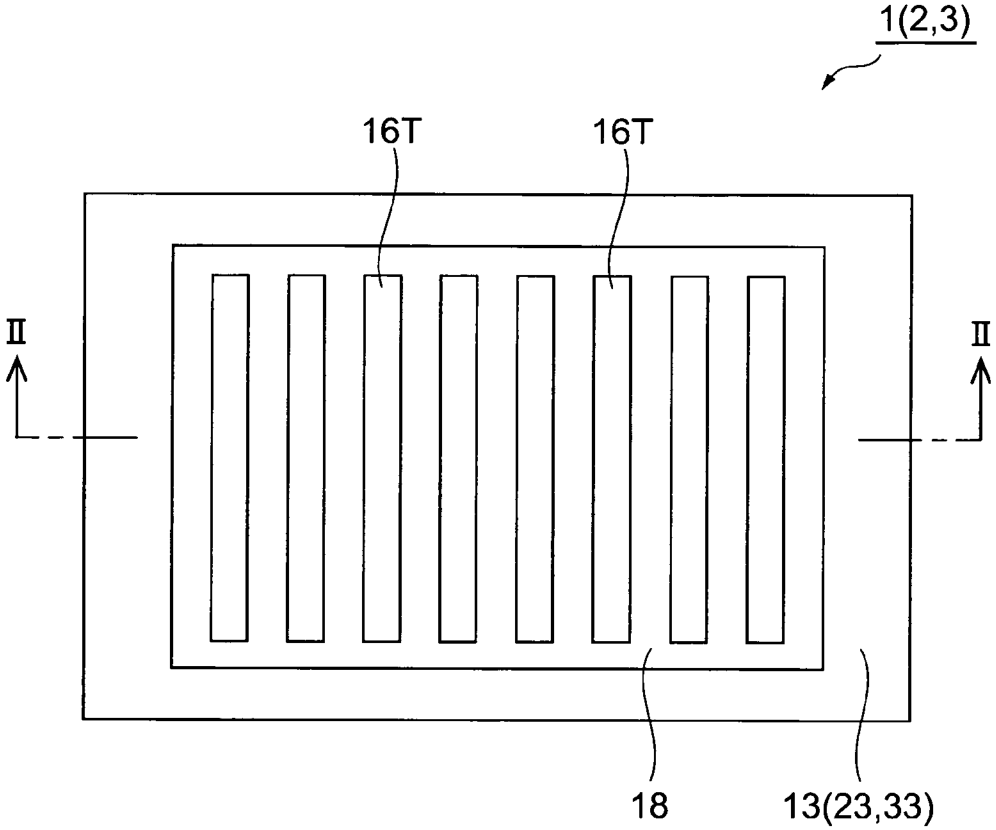
FIG. 1 is a plan view of a semiconductor photocathode according to an embodiment of the present invention.
Figure 2:
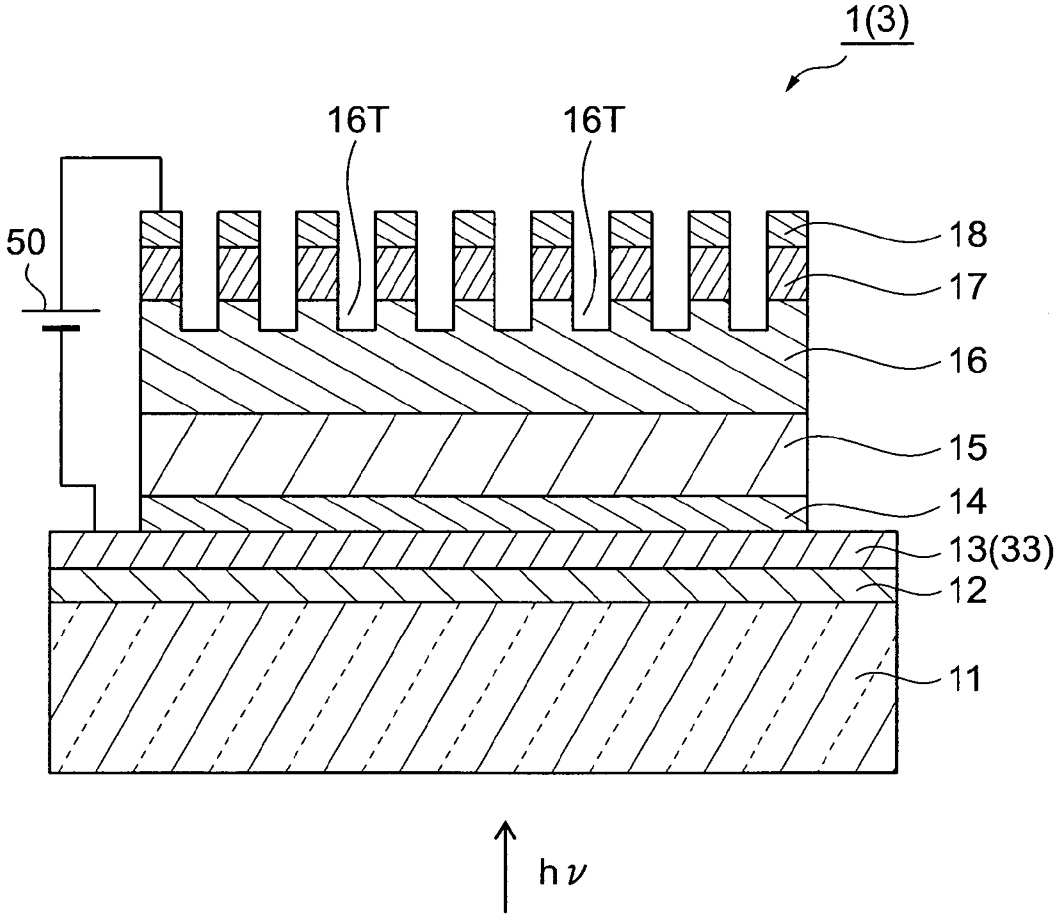
FIG. 2 is a sectional view of the semiconductor photocathode taken on line II-II of FIG. 1.

FIG. 1 is a plan view of a transmission-type semiconductor photocathode 1 according to a first embodiment, and FIG. 2 is a sectional view taken on line II-II of FIG. 1.

The semiconductor photocathode 1 includes a transparent substrate 11, an intermediate film (insulating film or antireflection film) 12, a first electrode 13, a window layer 14, a light absorbing layer 15, an electron emission layer 16, a contact layer 17, and a second electrode 18. The window layer 14, the light absorbing layer 15, the electron emission layer 16, and the contact layer 17 are arranged as a semiconductor multilayer film that serves the role of photoelectric conversion.

The transparent substrate 11 is formed of a material that is not restricted in the short wavelength sensitivity end and transmits an incident light hv of a wide wavelength band spanning from an ultraviolet band to a near infrared band. As the material of the transparent substrate 11, for example, glass or quartz is used. The transparent substrate 11 is a portion that maintains the mechanical strength of the semiconductor photocathode 1 and may be a portion of a vacuum container in a case of incorporation in an electron tube.

By providing the intermediate layer 12 as an insulating film interposed between the transparent substrate 11 and the first electrode 13, adherence of the transparent substrate 11 and semiconductor materials can be improved. Also, by providing intermediate layer 12 as an antireflection film interposed between the transparent substrate 11 and the first electrode 13, reflectance at desired wavelengths can be reduced in regard to light made incident on the light absorbing layer 15 and the photoelectron emission efficiency can be improved.

The first electrode 13 is arranged as a metal material layer of extremely thin thickness that is formed on the transparent substrate 11 and is arranged as an incidence side electrode that enables passage of the light transmitted through the transparent substrate 11. The first electrode 13 is formed of a material, such as W (tungsten), Mo (molybdenum), Ni (nickel), Ti (titanium), and Cr (chromium), and the thickness thereof is preferably no less than 5 nm and no more than 200 nm and more preferably no less than 10 nm and no more than 50 nm. For example, the first electrode 13 can be formed of tungsten of 10 nm thickness.

By arranging the first electrode 13 in this manner, light arriving at the first electrode 13 can be made to pass through toward the light absorbing layer 15 across a wide wavelength band with the first electrode 13 having a thickness that is controllable in terms of manufacture. Also, light of a wide wavelength band from an ultraviolet band to a near infrared band can be transmitted favorably while applying a bias voltage uniformly on the semiconductor photocathode. Especially in a case where the thickness is made no less than 10 nm and no more than 50 nm, because both a more uniform film quality and a low surface resistance can be realized at the same time, an effect of enabling a uniform bias field to be formed while maintaining a high transmittance is provided.

The window layer 14 is arranged as a layer of a semiconductor material of extremely thin thickness that is formed on the first electrode 13. This window layer 14 is formed of a p-type semiconductor material (for example, InP) that is lattice matched to a semiconductor material of the light absorbing layer 15 to be described later, and functions not only as a window layer that transmits the incident light hv but also as a p contact layer having a function for application of a bias voltage. Furthermore and as shall be described later, the window layer 14 is wider in energy band gap than the light absorbing layer 15 and thus also has a function of preventing the photoelectrons, generated at the light absorbing layer, from diffusing to the transparent substrate side. Here, that a certain crystal is lattice matched to the semiconductor material of the window layer means that when the window layer is formed of InP, the difference between the lattice constant of the crystal and the lattice constant of InP is within ±0.5% of the lattice constant of InP.

The thickness of the window layer 14 is preferably no less than 10 nm and no more than 200 nm and more preferably no less than 20 nm and no more than 100 nm. For example, the window layer 14 may be formed of p-type InP of 50 nm thickness. By thus arranging the window layer 14, the bias voltage can be applied favorably with the window layer 14 having a thickness by which a uniform layer can be formed, and light of a wide wavelength band from an ultraviolet band to a near infrared band can be transmitted favorably. Especially in a case where the thickness of the window layer 14 is made no less than 20 nm and no more than 100 nm, the effects of transmitting the incident light hv with good efficiency and blocking the diffusion of the photoelectrons, excited at the light absorbing layer 15, to the first electrode and thereby transferring the photoelectrons to the electron emission layer 16 side efficiently are provided. A carrier concentration of the window layer 14 is preferably no less than $1\times10^{17}$ $cm^{-3}$ and no more than $1\times10^{19}$ $cm^{-3}$. In this case, the effect that a uniform bias voltage can be applied to the light absorbing layer 15 is provided.

A semiconductor material, besides p-type InP, that is lattice matched to the light absorbing layer 15 and has an energy gap greater than that of the light absorbing layer 15 may be used as the material of the window layer 14.

The light absorbing layer 15 excites photoelectrons in response to the incident light hv and is formed on the window layer 14. The light absorbing layer 15 is formed of a semiconductor material (for example, p-type InGaAs of high resistance) that is narrower in energy band gap than the window layer 14 and is latticed matched to the window layer 14. The light absorbing layer 15 may be made no less than 20 nm and no more than 5000 nm in thickness and no less than $1\times10^{15}$ $cm^{-3}$ and no more than $1\times10^{17}$ $cm^{-3}$ in carrier concentration. As the material of the light absorbing layer 15, a compound semiconductor, selected from among p-type InGaAsP, p-type InAlGaAs, etc., may be used besides p-type InGaAs.

The electron emission layer 16 is wider in energy band gap than the light absorbing layer 15, emits the photoelectrons excited at the light absorbing layer 15 to the exterior from a surface, and is formed on the light absorbing layer 15. This electron emission layer 16 is formed of a semiconductor material (such as p-type InP) that is lattice matched to the light absorbing layer 15. In the electron emission layer 16, openings 16T of approximately 1000 nm width are formed in the form of stripes to enable electrons to be emitted to the exterior. In the case of the semiconductor photocathode 1 shown in FIGS. 1 and 2, the openings 16T are formed in the form of stripes and openings of the same shape are formed in the contact layer 17 and the second electrode 18 as well. Though with the example shown in FIG. 1, the openings 16T are formed in the form of stripes, these may instead be formed in the form of a mesh and the shape is not restricted in particular as long as openings of uniform shape are provided.

The electron emission layer 16 may be made no less than 50 nm and no more than 2000 nm in thickness and no less than $5\times10^{15}$ $cm^{-3}$ and no more than $1\times10^{17}$ $cm^{-3}$ in carrier concentration. The openings 16T may be made no less than 100 nm and no more than 100000 nm in line width, and the openings 16T may be made no less than 100 nm and no more than 100000 nm in pitch. Besides p-type InP, a semiconductor material that is lattice matched to the light absorbing layer 15 and has an energy gap greater than that of the light absorbing layer 15 may be used as the material of the electron emission layer 16.

The contact layer 17 is interposed between the electron emission layer 16 and the second electrode 18 and is formed of a semiconductor material that is lattice matched to the electron emission layer 16. The contact layer 17 is an additional layer for making the bias voltage be applied effectively by lowering a contact resistance between the electron emission layer 16 and the second electrode 18 and is formed, for example, of n-type InP. In a case where p-type semiconductor materials are used in the light absorbing layer 15 and the electron emission layer 16 and an n-type semiconductor material is used as the contact layer 17, the contact layer 17 is an n contact layer 17. The contact layer 17 may be made no less than 50 nm and no more than 10000 nm in thickness and no less than $1\times10^{17}$ $cm^{-3}$ and no more than $1\times10^{19}$ $cm^{-3}$ in carrier concentration. Besides n-type InP, a semiconductor material that is lattice matched to the light absorbing layer 15 and has an energy gap greater than that of the light absorbing layer 15 may be used as the material of the contact layer 17.

The second electrode 18 is formed on the electron emission layer 16 and is formed, for example, of Ti. By providing the second electrode 18, the bias voltage can be applied to the light absorbing layer 15 and the electron emission layer 16. In the present embodiment, the second electrode 18 is formed on the contact layer 17 and is arranged as a photoelectron emitting side electrode. The second electrode 18 may be made no less than 5 nm and no more than 1000 nm in thickness. Al, Pt, Ag, Au, Cr, or an alloy of these, etc., may be used besides Ti as the material of the second electrode 18.

(Operation of the Semiconductor Photocathode)

An operation of the semiconductor photocathode 1 shall now be described. To apply a bias voltage of a reverse direction from the exterior, a high potential terminal side of a bias voltage source 50 is connected to the second electrode 18 and a low potential terminal side of the bias voltage source 50 is connected to the first electrode 13 as shown in FIG. 13.

With the semiconductor photocathode 1 thus connected, when the incident light hv is made incident from the transparent substrate 11 side in the state in which the bias voltage is applied, though a portion of the light is reflected or absorbed by the first electrode 13 and the window layer 14, the rest of the light reaches the light absorbing layer 15. Electrons resulting from photoelectric conversion at the light absorbing layer 15 are then emitted to the exterior from the surface of the electron emission layer 16.

(Method for Manufacturing the Semiconductor Photocathode)

A method for manufacturing the semiconductor photocathode according to the embodiment shall now be described. FIGS. 3A, 3B, 3C, 4A, 4B, and 4C are sectional views of a manufacturing process of the semiconductor photocathode 1.

Figure 3A:
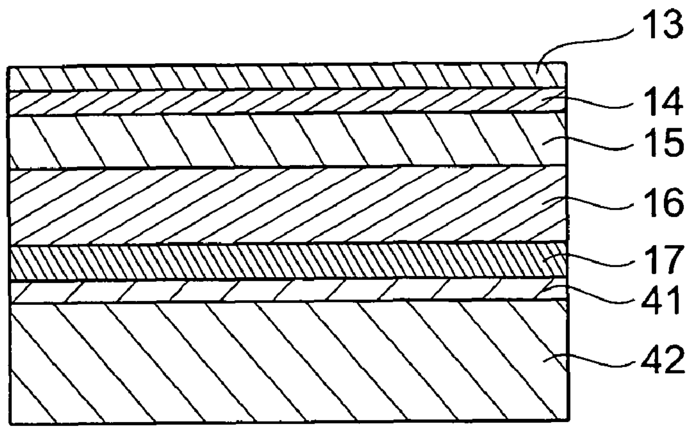
FIGS. 3A, 3B, and 3C are sectional views of a manufacturing process of the semiconductor photocathode.

First, an InP substrate 42 is prepared. Then, by MOCVD (metal organic chemical vapor deposition), crystal growths of an etching stop layer 41, formed of InGaAs, the contact layer 17 (for example, n-type InP), the electron emission layer 16 (for example, p-type InP), the light absorbing layer 15 (for example, p-type InGaAs), and the window layer 14 (for example, p-type InP) are carried out successively on the InP substrate 42. Subsequently, the first electrode 13 (for example, tungsten) is vacuum deposited onto the window layer 14 (FIG. 3A).

Figure 3B:
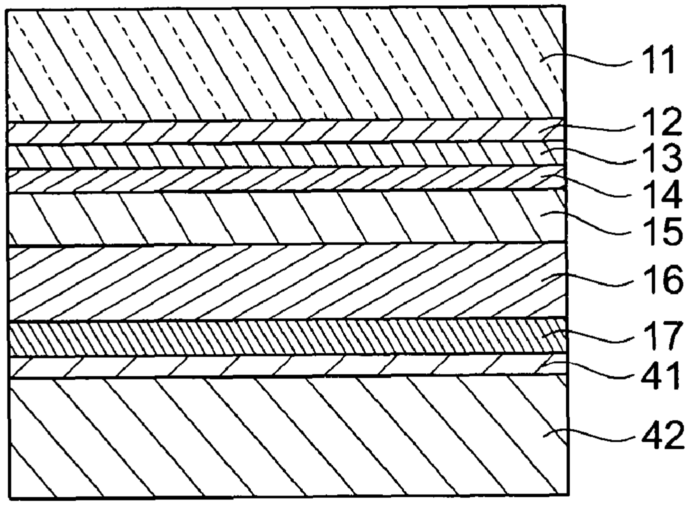

Then, after depositing the intermediate film 12 (for example, a silicon dioxide film) by plasma-enhanced CVD (plasma-enhanced chemical vapor deposition), the wafer is adhered onto the transparent substrate 11 (for example, glass) by thermocompression bonding (FIG. 3B).

Figure 3C:
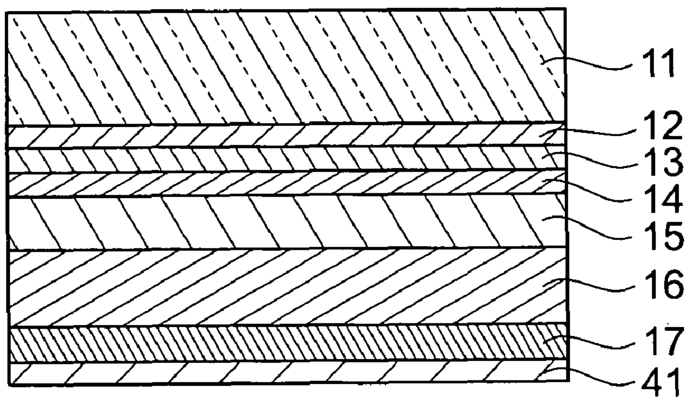

By etching the wafer, made integral with the transparent substrate 11, by immersing the wafer in heated hydrochloric acid, the entirety of the InP substrate 42 is removed. This etching step is stopped automatically by the etching stop layer 41 (FIG. 3C).

Thereafter, by etching the etching stop layer 41 by a sulfuric-acid-based etchant, a substrate, having the contact layer

Figure 4A:
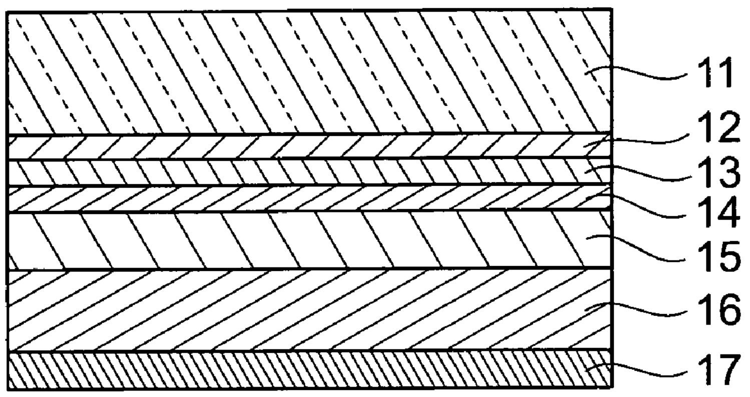
FIGS. 4A, 4B, and 4C are sectional views of a manufacturing process of the semiconductor photocathode.

17 as a top surface and the transparent substrate 11 as the rear surface, is prepared (FIG. 4A).

Figure 4B:
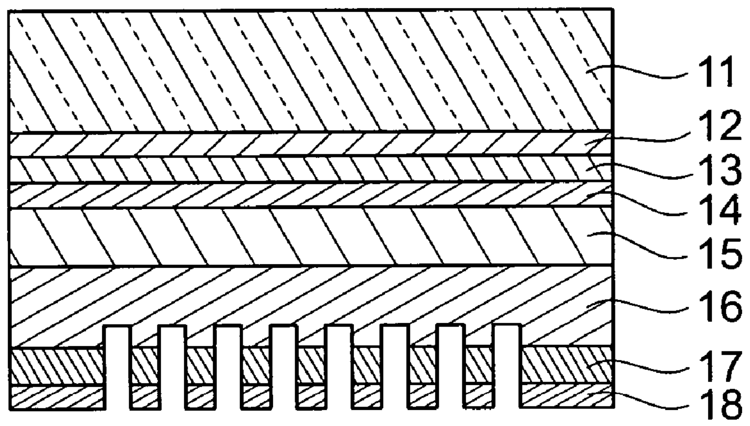

The second electrode 18 is then vacuum deposited, and by photolithography and RIE dry etching (reactive ion etching), a stripe pattern is formed on the electron emission layer 16, the contact layer 17, and the second electrode 18. Electron emitting portions for emitting electrons to the exterior of the semiconductor photocathode 1 are thereby formed in the electron emission layer 16 (FIG. 4B).

Figure 4C:
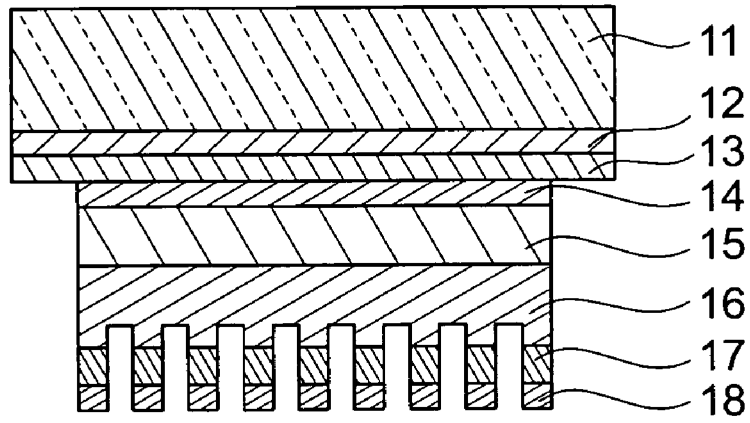

Lastly, by photolithography and chemical etching using hydrochloric acid and sulfuric acid type etchants, the first electrode 13 is exposed, and the semiconductor photocathode 1, shown in FIG. 2, is prepared (FIG. 4C).

(Characteristics of the Semiconductor Photocathode)

Figure 5:
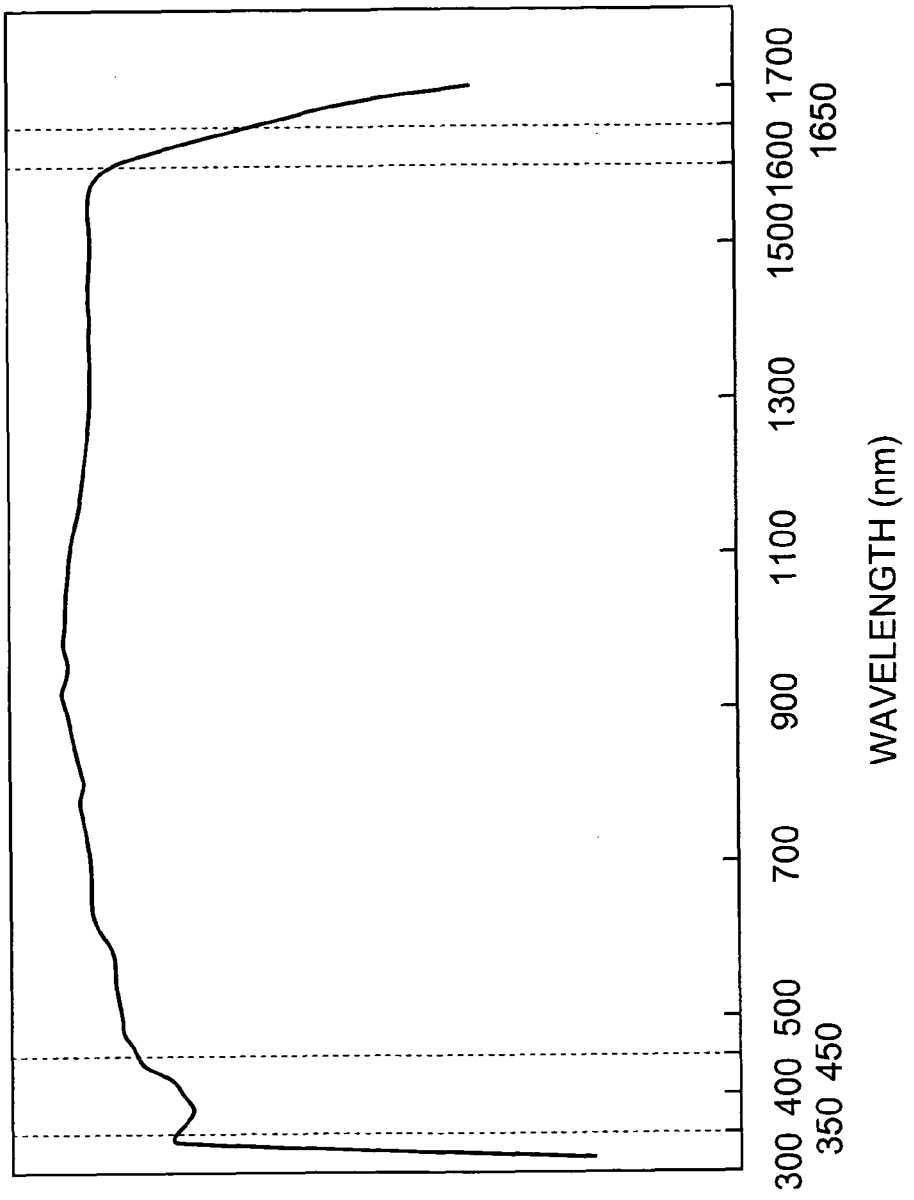
FIG. 5 is a diagram of characteristics data of the semiconductor photocathode according to the embodiment of the present invention.

FIG. 5 is a diagram of characteristics data of the semiconductor photocathode according to the first embodiment. As shown in FIG. 5, with the semiconductor photocathode according to the present embodiment, a flat trend of low fluctuation width is obtained for the sensitivity over a wide wavelength band from 350 nm in the ultraviolet band to 1650 nm. Especially in a wavelength band from 450 nm to 1600 nm, a flat trend of low fluctuation width is obtained at higher sensitivity.

Effects of the semiconductor photocathode according to the embodiment with the above arrangement shall now be described. With the semiconductor photocathode according to the embodiment, though the window layer 14 that is lattice matched to the semiconductor material of the light absorbing layer 15 is formed on the light absorbing layer 15 in order to form the light absorbing layer 15, the thickness of the window layer 14 is made extremely thin. Thus, for a wide wavelength band from an ultraviolet band to a near infrared band, light that is transmitted through the transparent substrate in the state in which the bias voltage is applied passes through the first electrode and is made incident on the light absorbing layer to excite photoelectrons without being blocked by the window layer. A semiconductor photocathode having a flat sensitivity for light of a wide wavelength band is thus provided.

In other words, with the semiconductor photocathode 1, in the state in which the bias voltage is applied, not only light of the near infrared band exceeding 780 nm but light of the visible band and light of the ultraviolet band from 350 nm to 450 nm can be made to reach the light absorbing layer 15. Because a single semiconductor photocathode can thus be provided with sensitivity for a wide wavelength band from an ultraviolet band to a near infrared band, separate photocathodes do not have to be used according to the wavelength of the detected light in incorporation into a photomultiplier tube, image intensifier tube, streak tube, or other electron tube. Thus, not only can improvements be made in regard to the lowering of precision due to preparing separate photodetectors for excitation light and for fluorescence, but the structure of a measuring device can also be simplified to enable size reduction and cost reduction.

Specifically, for time-resolved fluorescence measurement, because simultaneous measurement of excitation light pulses (generally of a shorter wavelength than a fluorescence wavelength) and fluorescence is enabled, not only can the measurement precision be improved but size reduction and cost reduction of a device can be realized as well. Also, by combining with a compact, maintenance-free cooler, a photodetector that can accommodate a wide wavelength band can be manufactured.

Second Embodiment

A transmission-type semiconductor photocathode according to a second embodiment of the present invention shall now be described.

Figure 6:
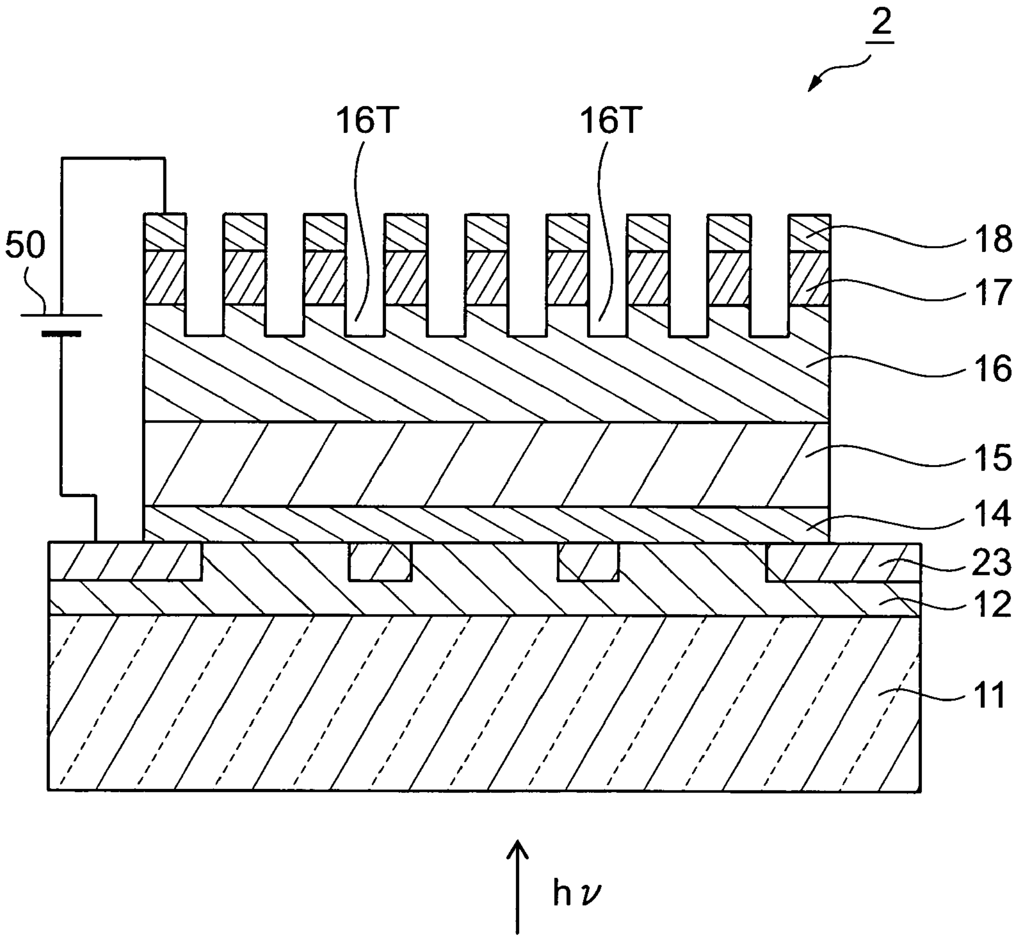
FIG. 6 is a sectional view of a semiconductor photocathode according to another embodiment of the present invention.

FIG. 6 is a sectional view of the transmission-type semiconductor photocathode 2 according to the second embodiment. Because the plan view of the semiconductor photocathode 2 is the same as FIG. 1, description shall be omitted by providing elements corresponding to those of FIG. 1 with the same symbols.

A difference of the present embodiment with respect to the first embodiment is a first electrode 23 that is disposed at the light incidence side, and other elements are the same as those of the first embodiment. With the present embodiment, the first electrode 23 differs from that of the first embodiment in being arranged as a metal material layer having openings 23B. Specifically, as shown in the plan view of FIG. 7, by providing the plurality of openings 23B in the first electrode 23, the first electrode 23 is patterned in the form of stripes.

The metal material that forms the first electrode 23 is not restricted in particular, and as with the first electrode 13 according to the first embodiment, the first electrode 23 can be formed from a material among W (tungsten), Mo (molybdenum), Ni (nickel), Ti (titanium), Cr (chromium), etc. The thickness of the first electrode 23 is also not restricted in particular, and in a case where tungsten is used as the metal material, the thickness may be 100 nm.

The semiconductor photocathode 2 that is thus arranged can be made to operate by applying the bias voltage using the bias voltage source 50 in the same manner as in the first embodiment. With the present embodiment, because the plurality of openings 23B are provided in the form of stripes, though light that is made incident on the transparent substrate 11 is blocked by substantially 100% by line portions 23A and edges 23C, the light passes through without being blocked at openings 23B. The light transmitted through the transparent substrate can thus be passed through toward the light absorbing layer 15.

In the present embodiment, though the number of openings 23B is not restricted in particular, to make the light transmitted through the transparent substrate pass through efficiently, an opening percentage β, expressed by the following equation, with w1 being a line width of each line portion 23A and w2 being a pitch width at which openings 23B are to be provided, is preferably made as large as possible.

$$\beta=\{1-(w1/w2)\}\times 100 \quad \text{(Equation)}$$

For example, the line width w1 of the line portion 23A may be set to 5000 nm and the pitch w2 of the openings 23B may be set to 100000 nm. In this case, the opening percentage β is 95%.

Figure 7:
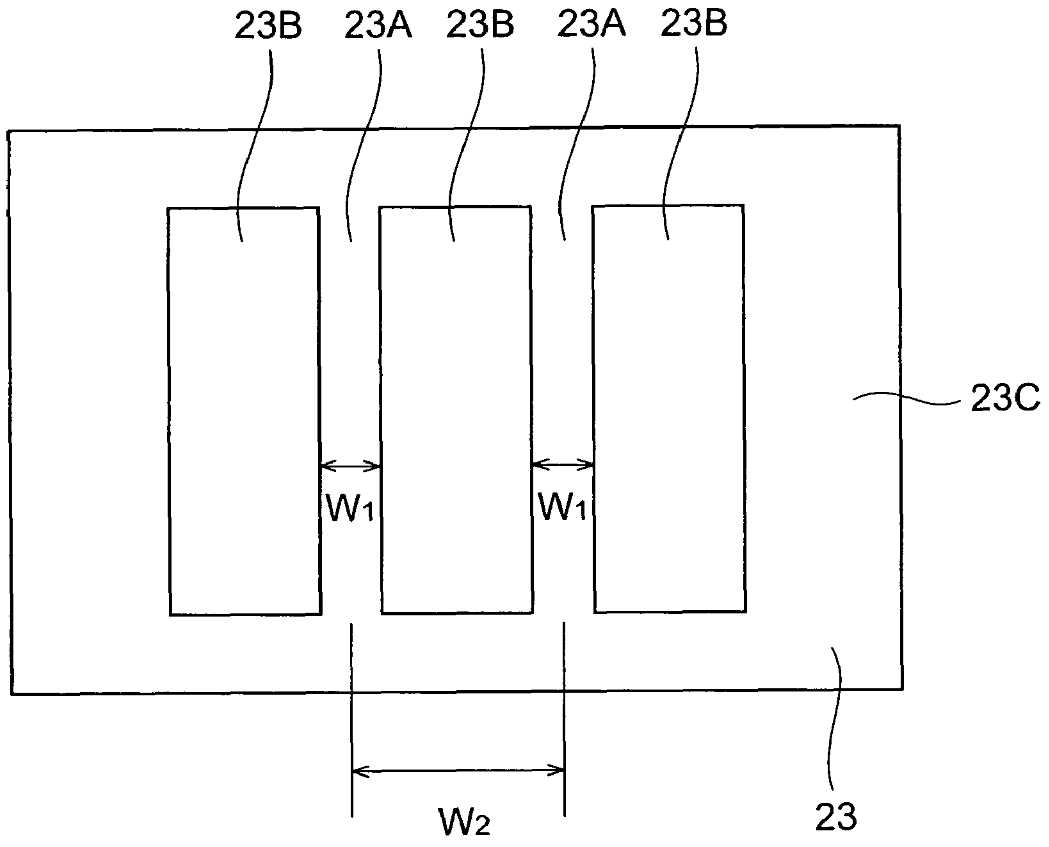
FIG. 7 is a plan view of a first electrode in a semiconductor photocathode according to another embodiment of the present invention.

Preferably, with the openings 23B, the line width w1 is made no less than 500 nm and no more 50000 nm, and the pitch w2 is made no less than 500 nm and no more than 500000 nm. By setting the line width w1 and the pitch w2 in the above ranges, the bias voltage can be applied effectively to the semiconductor photocathode, and the semiconductor photocathode can be formed with good reproducibility by photolithography. Though FIG. 7 shows a case where the plurality of openings 23B are aligned in the form of stripes, a plurality of openings may instead be aligned in a different mode, such as in the form of a mesh, concentric circles, etc.

The method for manufacturing the semiconductor photocathode 2 according to the present embodiment is substantially the same as the method for manufacturing the semiconductor photocathode 1 according to the first embodiment. However, a difference with respect to the manufacturing method for the first embodiment is that after the step of vacuum depositing the first electrode 13 on the window layer 14, shown in FIG. 3A, a step of forming the plurality of openings 23B by a photolithography process and RIE dry etching is added.

Third Embodiment

A transmission-type semiconductor photocathode according to a third embodiment shall now be described. Because the semiconductor photocathode according to the present embodiment is the same as the first embodiment in plan view and sectional view, corresponding elements shall be provided with the corresponding symbols and description thereof shall be omitted.

A difference between the present embodiment and the first embodiment is a first electrode 33 that is disposed at the light incidence side of the semiconductor photocathode 3 (see FIG. 2), and other elements are the same as those of the first embodiment. Specifically, the present embodiment differs from the first embodiment in that the first electrode 33 is formed of a transparent conductive material. The transparent conductive material making up the first electrode 33 may be at least one type of material selected from the group consisting of ITO, ZnO, $In_2O_3$, and $SnO_2$. ITO, ZnO, $In_2O_3$, and $SnO_2$ are all transparent oxide semiconductors. The thickness of the first electrode 33 is preferably no less than 100 nm and no more than 5000 nm and more preferably no less than 200 nm and no more than 1000 nm.

The semiconductor photocathode 3 thus arranged can be made to operate by applying the bias voltage using the bias voltage source 50 in the same manner as the first embodiment. In the present embodiment, because the first electrode 33 is formed of a transparent conductive material, it has a property of transmitting light while having the function of an electrode. Light transmitted through the transparent substrate can thus be passed through toward the light absorbing layer 15.

The method for manufacturing the semiconductor photocathode 3 according to the present embodiment is substantially the same as the method for manufacturing the semiconductor photocathode 1 according to the first embodiment. However, a difference with respect to the manufacturing method for the first embodiment is that in the step of vacuum depositing the first electrode 13 onto the window layer 14 shown in FIG. 3A, the first electrode 33, formed of the transparent conductive material, is formed in place of the first electrode 13, formed of the metal material.

What is claimed is:

1. A semiconductor photocathode comprising:

a transparent substrate;

a first electrode, formed on the transparent substrate and enabling passage of light that has been transmitted through the transparent substrate;

a light absorbing layer comprised of a compound semiconductor, formed on the first electrode and in which photoelectrons are excited in response to the incidence of light;

a window layer, interposed between the first electrode and the light absorbing layer and being formed of a semiconductor material that is wider in energy band gap than the light absorbing layer, and is lattice matched to the light absorbing layer, wherein a total thickness of the window layer between the first electrode and the light absorbing layer is no less than 10 nm and no more than 200 nm;

an electron emission layer, formed on the light absorbing layer, formed of a semiconductor material that is lattice matched to the light absorbing layer, and emitting the photoelectrons excited in the light absorbing layer to the exterior from a surface; and a second electrode, formed on the electron emission layer, wherein the electron emission layer comprises a plurality of openings, the plurality of openings is made no less than 100 nm and no more than 100000 nm in line width, and is made no less than 100 nm and no more than 100000 nm in pitch.

2. The semiconductor photocathode according to claim 1, wherein the first electrode is a metal material with a thickness of no less than 5 nm and no more than 200 nm.

3. The semiconductor photocathode according to claim 1, wherein the first electrode is a metal material with a thickness of no less than 10 nm and no more than 50 nm.

4. The semiconductor photocathode according to claim 1, wherein the first electrode is a metal material layer having openings.

5. The semiconductor photocathode according to claim 1, wherein the first electrode is formed of at least one type of transparent conductive material selected from the group consisting of ITO, ZnO, $In_2O_3$, and $SnO_2$.

6. The semiconductor photocathode according to claim 1, wherein the thickness of the window layer is no less than 20 nm and no more than 100 nm.

7. The semiconductor photocathode according to claim 1, further comprising: a contact layer, interposed between the electron emission layer and the second electrode and formed of a semiconductor material that is lattice matched to the electron emission layer, wherein the contact layer is comprised of InP, has a thickness of no less than 50 nm and no more than 10000 nm, and has a carrier concentration of no less than $1\times10^{17}$ $cm^{-3}$ and no more than $1\times10^{19}$ $cm^{-3}$.

8. The semiconductor photocathode according to claim 1, further comprising:

an insulating film, interposed between the transparent substrate and the first electrode, wherein the transparent substrate is comprised of glass or quartz, and wherein the insulating film is comprised of silicon dioxide that is bonded to the transparent substrate by a thermocompression bonding.

9. The semiconductor photocathode according to claim 1, further comprising: an antireflection film, interposed between the transparent substrate and the first electrode.

10. The semiconductor photocathode according to claim 1, wherein the material of the light absorbing layer is at least one type of compound semiconductor selected from the group consisting of p-type InGaAs, p-type InGaAsP, and p-type InAlGaAs.

11. The semiconductor photocathode according to claim 1, wherein the light absorbing layer has a thickness of no less than 20 nm and no more than 5000 nm and a carrier concentration of no less than $1\times10^{15}$ $cm^{-3}$ and no more than $1\times10^{17}$ $cm^{-3}$.

12. The semiconductor photocathode according to claim 1, wherein the transparent substrate is comprised of glass or quartz.

13. A semiconductor photocathode comprising:

a transparent substrate;

a first electrode, formed on the transparent substrate and enabling passage of light that has been transmitted through the transparent substrate;

a light absorbing layer comprised of a compound semiconductor, formed on the first electrode and in which photoelectrons are excited in response to the incidence of light;

a window layer, interposed between the first electrode and the light absorbing layer and being formed of a semiconductor material that is wider in energy band gap than the light absorbing layer, and is lattice matched to the light absorbing layer, wherein a total thickness of the window layer between the first electrode and the light absorbing layer is no less than 10 nm and no more than 200 nm;

an electron emission layer, formed on the light absorbing layer, formed of a semiconductor material that is lattice matched to the light absorbing layer, and emitting the photoelectrons excited in the light absorbing layer to the exterior from a surface; and a second electrode, formed on the electron emission layer, wherein the window layer is comprised of InP, and a carrier concentration of the window layer is no less than $1\times10^{17}$ $cm^{-3}$ and no more than $1\times10^{19}$ $cm^{-3}$, wherein the light absorbing layer is comprised of InGaAs, InGaAsP or InAlGaAs, has a thickness of no less than 20 nm and no more than 5000 nm, and has a carrier concentration of no less than $1\times10^{15}$ $cm^{-3}$ and no more than $1\times10^{17}$ $cm^{-3}$, wherein the electron emission layer is comprised of InP, having a thickness of no less than 50 nm and no more than 2000 nm, and has a carrier concentration of no less than $5\times10^{15}$ $cm^{-3}$ and no more than $1\times10^{17}$ $cm^{-3}$, and wherein the electron emission layer comprises a plurality of openings, the plurality of openings is made no less than 100 nm and no more than 100000 nm in line width, and is made no less than 100 nm and no more than 100000 nm in pitch.

14. A semiconductor photocathode comprising:

a transparent substrate;

a first electrode, formed on the transparent substrate and enabling passage of light that has been transmitted through the transparent substrate;

a light absorbing layer comprised of a compound semiconductor, formed on the first electrode and in which photoelectrons are excited in response to the incidence of light;

a window layer, interposed between the first electrode and the light absorbing layer and being formed of a semiconductor material that is wider in energy band gap than the light absorbing layer, and is lattice matched to the light absorbing layer, wherein a total thickness of the window layer between the first electrode and the light absorbing layer is no less than 10 nm and no more than 200 nm;

an electron emission layer, formed on the light absorbing layer, formed of a semiconductor material that is lattice matched to the light absorbing layer, and emitting the photoelectrons excited in the light absorbing layer to the exterior from a surface; and a second electrode, formed on the electron emission layer, the semiconductor photocathode further comprising: a contact layer, interposed between the electron emission layer and the second electrode and formed of a semiconductor material that is lattice matched to the electron emission layer, wherein the contact layer is comprised of InP, has a thickness of no less than 50 nm and no more than 10000 nm, and has a carrier concentration of no less than $1\times10^{17}$ $cm^{-3}$ and no more than $1\times10^{19}$ $cm^{-3}$, wherein the window layer is comprised of InP, and a carrier concentration of the window layer is no less than $1\times10^{17}$ $cm^{-3}$ and no more than $1\times10^{19}$ $cm^{-3}$;

wherein the light absorbing layer is comprised of InGaAs, InGaAsP or InAlGaAs, has a thickness of no less than 20 nm and no more than 5000 nm, and has a carrier concentration of no less than $1\times10^{15}$ $cm^{-3}$ and no more than $1\times10^{17}$ $cm^{-3}$, wherein the electron emission layer is comprised of InP, having a thickness of no less than 50 nm and no more than 2000 nm, and has a carrier concentration of no less than $5\times10^{15}$ $cm^{-3}$ and no more than $1\times10^{17}$ $cm^{-3}$, and wherein the electron emission layer comprises a plurality of openings, the plurality of openings is made no less than 100 nm and no more than 100000 nm in line width, and is made no less than 100 nm and no more than 100000 nm in pitch.

* * * * *